(12) United States Patent
Carpio et al.

(10) Patent No.: US 6,214,496 B1
(45) Date of Patent: Apr. 10, 2001

(54) METHOD FOR REDUCING CORNER ROUNDING IN MASK FABRICATION UTILIZING ELLIPTICAL ENERGY BEAM

(75) Inventors: Enio Luiz Carpio, Fishkill, NY (US); Wolfgang Besenbock, Munich (DE)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/280,615

(22) Filed: Mar. 29, 1999

(51) Int. Cl.[7] .................................................. G03F 9/00
(52) U.S. Cl. .................................................. 430/5; 430/296
(58) Field of Search ............................. 430/5, 296, 22, 430/30; 355/18; 250/492

(56) References Cited

U.S. PATENT DOCUMENTS

| | | | |
|---|---|---|---|
| 5,258,623 | * | 11/1993 | Kawai .................................. 250/561 |
| 5,525,840 | * | 6/1996 | Tominaga ............................. 257/797 |
| 5,847,959 | * | 12/1998 | Veneklasen ......................... 364/468 |
| 5,989,759 | * | 11/1999 | Ando et al. ............................ 430/22 |
| 6,040,114 | * | 3/2000 | Inoue et al. ......................... 430/296 |
| 6,121,942 | * | 9/2000 | Sanou et al. ........................... 345/75 |

\* cited by examiner

*Primary Examiner*—Mark F. Huff
*Assistant Examiner*—Saleha R. Mohamedulla
(74) *Attorney, Agent, or Firm*—Stanton C. Braden

(57) ABSTRACT

A method for fabricating mask patterns in accordance with the present invention includes the steps of providing a mask blank for patterning, propagating a laser/electron beam having an elliptical cross-sectional shape onto the mask blank, the elliptical cross-sectional shape having an elongated axis and edges at opposite ends of the elongated axis and positioning the mask blank to write a pattern on the mask blank wherein the positioning includes employing the edges of the elliptical cross-sectional shape of the laser/electron beam to write corners of the pattern. A system is also included.

12 Claims, 4 Drawing Sheets

METHOD FOR REDUCING CORNER ROUNDING IN MASK FABRICATION UTILIZING ELLIPTICAL ENERGY BEAM

BACKGROUND

1. Technical Field

This disclosure relates to semiconductor fabrication tools and more particularly, to an improved system and method for generating patterns on reticles used in semiconductor fabrication processes.

2. Description of the Related Art

Semiconductor fabrication processes typically include photolithographic processing to pattern areas of a surface of a semiconductor device. The semiconductor fabrication process typically includes applying a photoresist material to the surface of the semiconductor device. The photoresist is patterned by exposing the photoresist to light, typically ultraviolet light, to crosslink the resist material (negative resist). This cross linking prevents a reaction with a developer which develops away areas of the photoresist which were not crosslinked by the exposure to the UV light. Other types of photoresists have chains broken by exposure (positive resist) to ultraviolet light.

Photoresists are patterned using a photomask. The photomask functions as a shield to prevent light form passing through it in predetermined areas during photolithography. The photomask typically provides a black or highly absorbent layer of material, usually chromium or a chromium alloy, patterned in accordance with the patterning design to be projected onto the photoresist. The absorbent layer is formed on a substrate, which may include a glass or quartz material. Other techniques are used which may include electrons and electron beam masks, scattering masks and/or stencil masks, for example, scattering with angular limitation in projection electron beam lithography (SCALPEL).

With decreasing feature sizes of semiconductor components, masks are increasingly more difficult to fabricate and inspect. It is known that advanced semiconductor processing is very sensitive to image quality provided by masks. The defect fabrication capability for reticles is limited to a certain minimum feature size. This minimum feature size typically depends on the process and fabrication tools used to provide the pattern on the reticle.

Reticles may be written by laser pattern generators or electron beam pattern generators. Since reticles typically include a multitude of features below a micron in size. Fabrication is performed using automated devices. Referring to FIG. 1, a reticle fabrication device 10 is shown. Device 10 includes a stage 14 for positioning a mask or reticle 16 to be fabricated. An energy source 18 provides a laser beam or an electron beam for writing a pattern on mask 16 with a predetermined intensity of light or electrons. Mask 16 is preferably guided by stage 14 according to a computer generated image of the pattern to be written on mask 16.

Both laser and electron beam pattern generators have the capability for complex reticle patterns, including those with narrow geometries, dense optical proximity correction (OPC) and phase shift masks (PSM). OPC helps compensate for lost light to ensure that the precise patterns are formed on a semiconductor wafer. For example, without OPC, a rectangle can end up looking like an oval on the wafer because light tends to round on the edges. OPC corrects this by adding tiny serifs (lines) to the corner to ensure that the corners are not rounded or moving a feature edge so wafer features are sized more accurately. Phase shift masks alter the phase of light passing through the photomask, and permit improved depth of focus and resolution on the wafer. Phase-shift helps reduce distortion on line resolution of wafer surface irregularities.

Although laser pattern generator provide higher reticle throughput, lower cost and better placement accuracy, laser pattern generators produce large corner rounding. Referring to FIG. 2, a circular laser/electron beam spot 30 is shown for writing a pattern on for a reticle on a mask blank 32. Mask blank 32 includes a resist layer 33 formed on a blank mask 32. A pattern 34 is formed by exposing portions of resist to light or electrons. The pattern is created by applying laser/electron spot 30 thereon to expose resist 33. Typically, blank mask 32 includes an energy absorbent material, such as, chromium, molybdenum or their alloys, or metal oxides on a glass or quartz substrate. After exposure resist 33 is developed and exposed portions of energy absorbent material on blank mask 32 is etched away. As laser/electron spot 30 approaches a corner 38, resist 33 cannot be exposed in corner 38 as a result of the geometry of laser/electron spot 30. This is referred to as corner rounding. The large corner radius is related to the beam diameter as approximately equal to 1.17×beam diameter for laser beams. State of the art tools are capable of corner rounding as low as 300 nm.

Conventional solutions to large corner rounding include employing serifs, hammerheads and other types of add-on structures. The addition of these structures adds to the complexity of the reticle pattern, increases data volume for storing the reticle design and makes the reticle pattern more difficult to inspect due to the add-on features.

Therefore, a need exists for a system and method which reduces corner rounding in reticle fabrication processes. A further need exists for a system and method which reduces the need for add-on structures in reticle fabrication processes.

SUMMARY OF THE INVENTION

A method for fabricating mask patterns in accordance with the present invention includes the steps of providing a mask blank for patterning, propagating an energy beam having an elliptical cross-sectional shape onto the mask blank, the elliptical cross-sectional shape having an elongated axis and edges at opposite ends of the elongated axis and positioning the mask blank to write a pattern on the mask blank wherein the positioning includes employing the edges of the elliptical cross-sectional shape of the energy beam to write corners of the pattern.

Another method for fabricating mask patterns for processing semiconductor devices comprising the steps of providing a mask blank to be patterned, providing a design data set for a pattern to be written on the mask blank, propagating an energy beam having an elliptical cross-sectional shape onto the mask blank, the elliptical cross-sectional shape having an elongated axis and edges at opposite ends of the elongated axis and translating and rotating the mask blank according to the design data set to write a pattern on the mask blank wherein the rotating includes employing the edges of the elliptical cross-sectional shape of the energy beam to write corners of the pattern.

In alternate methods, the step of positioning may include the steps of mounting the mask blank on a positioner for positioning the mask blank. The step of propagating a energy beam may include the step of shaping the beam using a lens system. The step of propagating an energy beam may include the step of propagating an ultraviolet laser beam. The step of propagating an energy beam may include the step of propagating an electron beam. The step of positioning the mask blank preferably includes the step of writing corners by positioning the elongated axis of the energy beam at an angle that bisects an angle formed by adjacent sides of the corners.

A system for fabricating mask patterns in accordance with the present invention includes an energy source for providing an elliptical cross-sectional shape onto a mask blank, the elliptical cross-sectional shape having an elongated axis and edges at opposite ends of the elongated axis and a positioner for positioning the mask blank to write a pattern on the mask blank such that the edges of the elliptical cross-sectional shape of an energy beam are employed to write corners of the pattern.

In alternate embodiments, the system may further include a processor for providing control signals to the positioner for positioning the mask blank. The processor preferably includes a memory storage device, the memory storage device including a data set for providing digital data representing the pattern to the processor for producing the control signals. The energy beam is preferably shaped using a lens system. The energy beam preferably includes an ultraviolet laser beam or an electron beam having energies of about 50 keV or less.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to semiconductor fabrication tools and more particularly, to an improved system and method for generating patterns on reticles used in semiconductor fabrication processes. The present invention provides an elliptical beam which advantageously provides for smaller corner rounding when writing edges on a reticle used for semiconductor fabrication. Better accuracy writing is provided by manipulating the placement of the elliptical laser spot according to a special corner writing method which is preferably computer controlled. The special corner rounding method and the elliptically shaped laser/electron spot reduces the need for the use of add-on structures such as serifs, hammerheads, etc.

Figure 1:
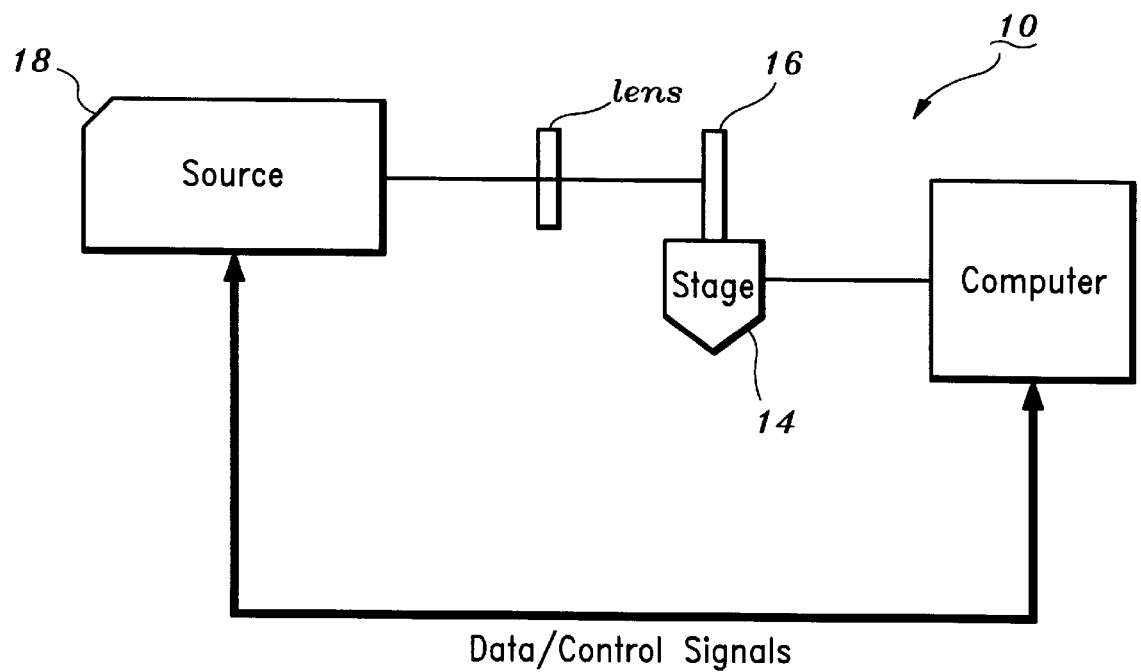
FIG. 1 is a block diagram of a conventional laser/electron pattern generator for writing masks for semiconductors fabrication processes.
Figure 2:
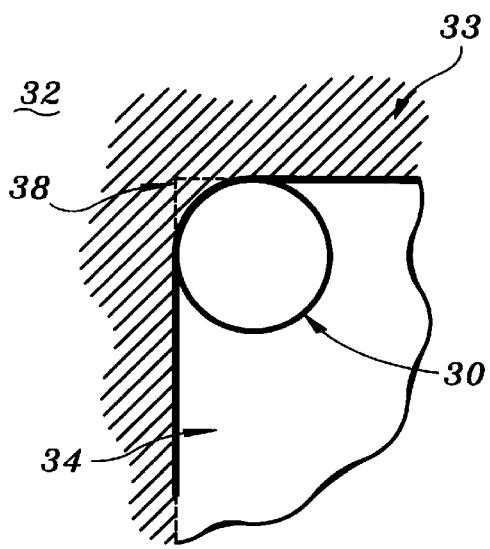
FIG. 2 is a cross-sectional view of a laser/electron beam which has a circular cross section which is used in accordance with the prior art.
Figure 4:
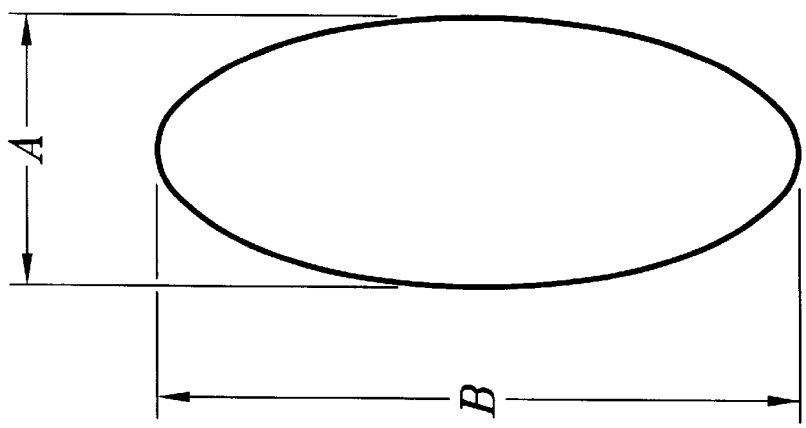
FIG. 4 is an illustration showing a shape and dimensions of the cross section of the elliptical beam used in accordance with the present invention.
Figure 3:
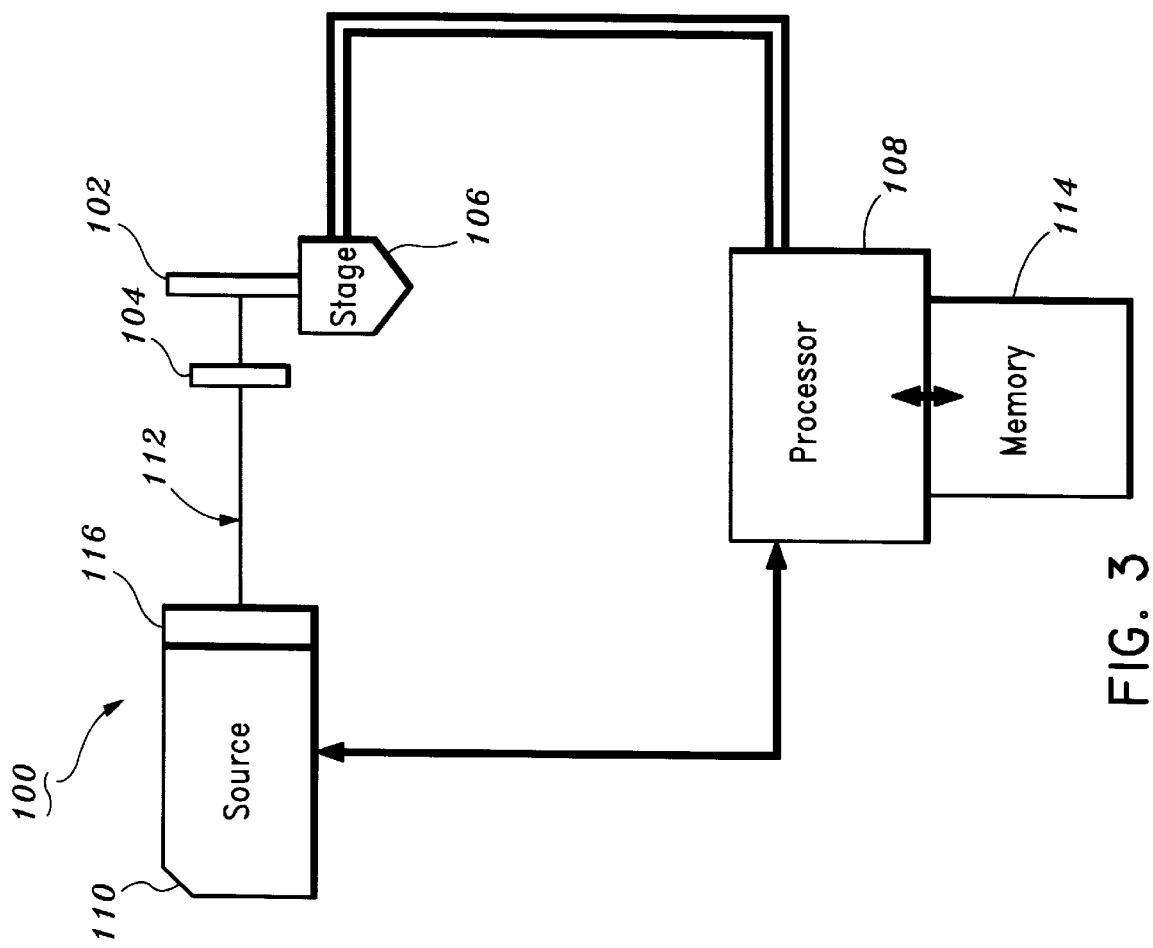
FIG. 3 is a block diagram of a pattern generator system in accordance with the present invention.

Referring now in specific detail to the drawings in which like reference numerals identify similar or identical elements throughout the several views, and initially to FIG. 3, a system 100 for pattern generation writing for fabricating a lithography mask 102 in accordance with the invention is shown. Mask 102 begins the process as a blank, that is, no pattern exists thereon. Blank Mask 102 includes an energy absorbent material, such as, chromium, molybdenum or their alloys, or metal oxides on a glass or quartz substrate. Mask 102 is mounted to a stage or positioner 106 or equivalent positioning device. Stage 106 is capable of accurately positioning mask 102 including rotations. A lens system 104 is included for focusing a laser/electron beam 112 generated by an energy source 110. Energy source 110 preferably generates light in the ultraviolet wavelengths or an electron beam with electrons having energies of about 50 keV or less. Energy source 110 may be, for example, an excimer laser. Lens system 104 controls the size and shape of a spot used to write a pattern on mask 102. In accordance with the invention, an elliptically shaped laser/electron spot is provided using lens system 104. Ellipticity of the beam may be created and controlled by the astigmatism of lens system 104, thereby varying dimensions A and B as shown in FIG. 4.

During fabrication, source 110 generates beam 112. Beam 112 is focused and shaped by lens system 104 which directs beam 112 onto mask 102. Mask 102 is manipulated by translating and rotating stage 106 according to a pattern which is preferably stored in memory 114 of a processor 108. Processor sends signals to control the stage's s motion to write the pattern stored in memory 114 on a resist layer. Source 110 is also preferably controlled by processor 108. Processor 108 sends signals to source 110 to turn beam 112 on and off in accordance with the pattern. Alternately, a shutter 116 may be used to halt the propagation of laser beam 112.

Other features may be included in system 100. For example, vibration isolation systems (not shown) may be used to isolate environmental vibration from impacting the writing process. Environmental conditions, such as ambient gases and gas flow in the vicinity of mask 102 may be provided and controlled. In addition, other embodiments of the present invention may maintain mask 102 stationary while manipulating source 110 by, for example, using mirrors or other suitable devices to deflect and control beam 112 position relative to mask 102.

Figure 5:
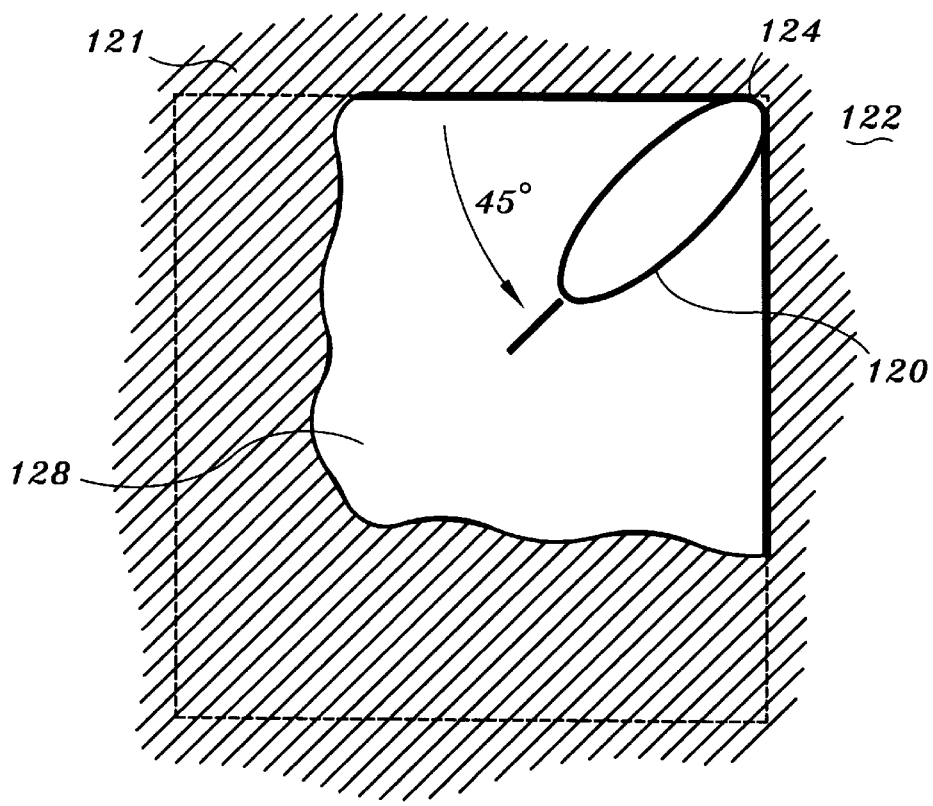
FIG. 5 is a cross-sectional view of a beam having an elliptical cross section which is used for writing corners of a pattern in accordance with the present invention.

Referring to FIG. 5, an elliptical laser/electron spot 120 is shown for writing a pattern 128 on a mask 122 or reticle in accordance with the present invention. By employing an elliptical spot 120, a corner radius 124 is reduced over conventional circular spots. Spot 120 may be positioned to have the elongated axis bisect the corner to be written. For optimal results spot 120 is angled at about 45 degrees to write perpendicular corners of the pattern on mask 122. In this way, corner rounding is minimized for corner radius 124. Due to the elongated shape of an ellipse, the present invention provides a rotating stage 106 (FIG. 3) to provide for both the rotation an translation of spot 120. Spot 120 is employed to expose a resist layer 121 for forming pattern 128 by subsequent development and etching of mask 122.

Figure 6:
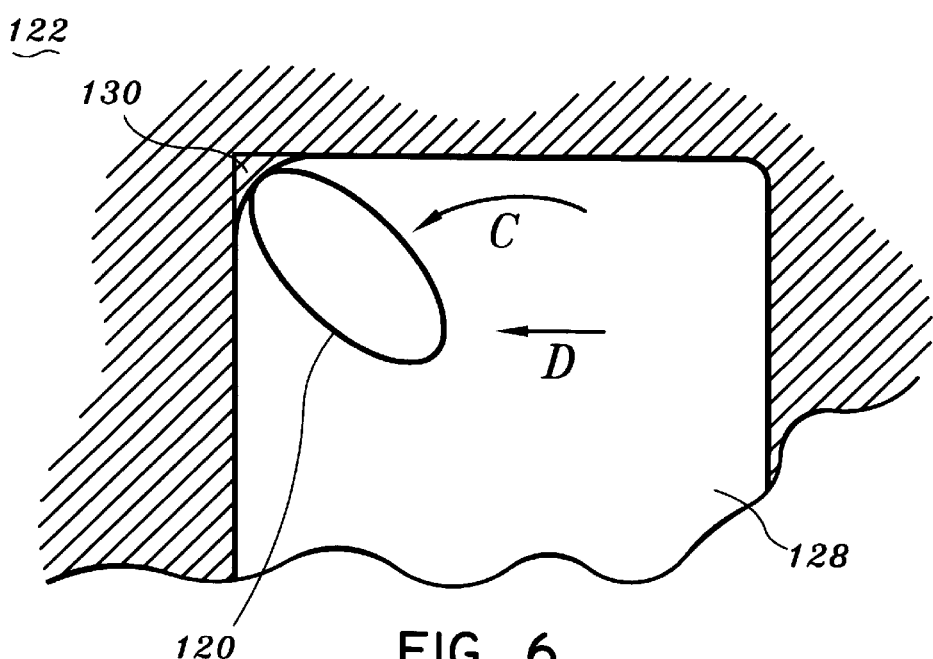
FIG. 6 is an illustration showing a translation and rotation of the elliptical laser beam to provide corner writing of an opposite corner of the pattern in accordance with the present invention.

Referring to FIG. 6, in forming pattern 128 which is written on mask 122, elliptical spot 120 is translated in the direction of arrow "D" and rotated in the direction of arrow "C". In this way, an opposite corner radius 130 may be written with the same reduction in corner rounding as for corner radius 124. Other configurations and geometries may also be written using similar techniques.

Figure 7:
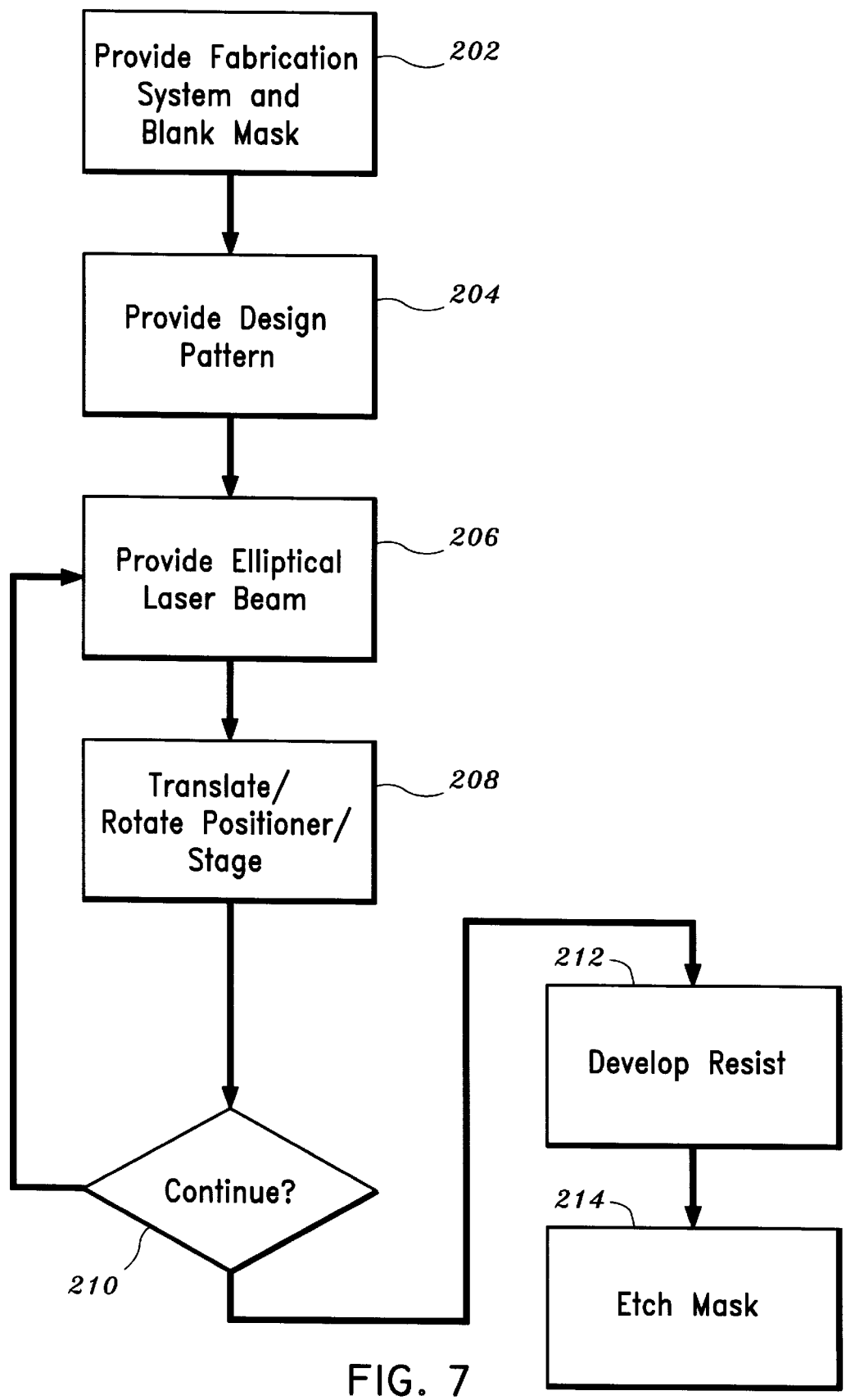
FIG. 7 is a flow/block diagram showing a method/system for generating patterns on masks in accordance in the present invention.

Referring to FIG. 7, a block/flow diagram for generating pattern in accordance with the present invention is illustratively shown. In a block 202, a system, such as system 100, is provided for fabricating masks or reticles in accordance with the invention. A blank mask is provided onto which a pattern is to be formed. As described above, the blank may include a glass, quartz or equivalent substrate having an energy absorbent layer formed thereon. A resist layer is formed on the blank for processing as follows. In block 204, a design pattern is preferably provided in the form of digital data to a processor which converts the data to a set of instructions for a stage on which a blank reticle or mask is mounted for patterning. In block 206, an elliptical beam is provided to write a pattern on the mask. The beam applies energy in the form of a laser or electron beam to pattern the resist. In block 208, the stage translates and rotates the mask in the presence of the elliptical laser beam in accordance with the instruction set provided by the processor. The processor may include software which includes predetermined laser/electron spot positioning schemes which align the elliptical spot with the corners to be written. In this way, the spot achieves the reduced corner rounding as described above. The method continues in block 210 until the mask blank has been completely patterned according to the design data. In block 212, the patterned resist on the mask is developed, and the remaining resist protects areas of the energy absorbent material on the substrate of the mask. An additional etching step is performed in block 214 to remove portions of the energy absorbent material in accordance with the resist pattern to form the mask.

The present invention, advantageously, achieves corner radius reduction without an increase in data volume of the design data since reliance on add-on structures such as serifs and hammerheads is reduced. Although additional manipulation of the elliptical spot is provided, not using add-on structures not only reduces data volume but dramatically reduces inspection time since small add-on structures are reduced in number. It is to be understood that the present invention may use the elliptical cross-sectional beam in conjunction with a circular cross-sectional beam. In this way, the circular beam may be used to perform bulk patterning operations while the elliptical beam may be used to write corners in the pattern. The same source may also be used for the beam while the shape form circular to elliptical (or vice versa) is performed by changing or modifying the lens system used.

Having described preferred embodiments for system and method for reducing corner rounding in mask fabrication (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for fabricating mask patterns comprising the steps of:

providing a mask blank for patterning;

propagating an energy beam having an elliptical cross-sectional shape onto the mask blank, the elliptical cross-sectional shape having an elongated axis and edges at opposite ends of the elongated axis; and positioning the mask blank to write a pattern on the mask blank wherein the positioning includes employing the edges at the opposite ends of the elongated axis of the elliptical cross-sectional shape of the energy beam to write corners of the pattern including writing corners by positioning the elongated axis of the elliptical cross-sectional shape of the energy beam at an angle that bisects an angle formed by adjacent sides of the corners.

2. The method as recited in claim 1, wherein the step of positioning includes the steps of mounting the mask blank on a positioner for positioning the mask blank.

3. The method as recited in claim 1, wherein the step of propagating an energy beam includes the step of shaping the energy beam using a lens system.

4. The method as recited in claim 1, wherein the step of propagating an energy beam includes the step of propagating an ultraviolet laser beam.

5. The method as recited in claim 1, wherein the step of propagating an energy beam includes the step of propagating an electron beam.

6. The method as recited in claim 5, wherein the electron beam includes electrons with energies of about 50,000 eV or less.

7. A method for fabricating mask patterns for processing semiconductor devices comprising the steps of:

providing a mask blank to be patterned;

providing a design data set for a pattern to be written on the mask blank;

propagating an energy beam having an elliptical cross-sectional shape onto the mask blank, the elliptical cross-sectional shape having an elongated axis and edges at opposite ends of the elongated axis; and translating and rotating the mask blank according to the design data set to write a pattern on the mask blank wherein the rotating includes employing the edges at the opposite ends of the elongated axis of the elliptical cross-sectional shape of the energy beam to write corners of the pattern including writing corners by positioning the elongated axis of the energy beam at an angle that bisects an angle formed by adjacent sides of the corners.

8. The method as recited in claim 7, wherein the step of positioning includes the step of mounting the mask blank on a positioner for positioning the mask blank.

9. The method as recited in claim 8, wherein the step of propagating an energy beam includes the step of shaping the energy beam using a lens system.

10. The method as recited in claim 8, wherein the step of propagating an energy beam includes the step of propagating an ultraviolet laser beam.

11. The method as recited in claim 7, wherein the step of propagating an energy beam includes the step of propagating an electron beam.

12. The method as recited in claim 11, wherein the electron beam includes electrons with energies of about 50,000 eV or less.

* * * * *

UNITED STATES PATENT AND TRADEMARK OFFICE
CERTIFICATE OF CORRECTION

PATENT NO.    : 6,214,496 B1
DATED         : April 10, 2001
INVENTOR(S)   : Carpi et al.

It is certified that error appears in the above-identified patent and that said Letters Patent is hereby corrected as shown below:

<u>Title page,</u>
Item [75], Inventors, the first-named inventor's name is Enio Luiz Carpi.

Signed and Sealed this

Fourteenth Day of May, 2002

Attest:

JAMES E. ROGAN
*Attesting Officer*    *Director of the United States Patent and Trademark Office*